(12) United States Patent
Liu

(10) Patent No.: US 8,049,466 B2
(45) Date of Patent: Nov. 1, 2011

(54) NETWORK DEVICE AND METHOD FOR INDICATING SIGNAL POWER TRANSMITTED AND BATTERY CAPACITANCE OF SAME

(75) Inventor: Yu-Hai Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 706 days.

(21) Appl. No.: 12/206,733

(22) Filed: Sep. 8, 2008

(65) Prior Publication Data
US 2009/0267610 A1    Oct. 29, 2009

(30) Foreign Application Priority Data
Apr. 28, 2008    (CN) .......................... 2008 1 0301370

(51) Int. Cl.
*H02J 7/00*    (2006.01)
*H02J 7/04*    (2006.01)
*H02J 7/16*    (2006.01)
*H02J 7/06*    (2006.01)

(52) U.S. Cl. ........ 320/132; 320/152; 320/157; 320/159; 320/164

(58) Field of Classification Search .................. 320/132
See application file for complete search history.

(56) References Cited

U.S. PATENT DOCUMENTS
2004/0232885 A1*  11/2004  Sakai et al. ................. 320/132
2009/0113045 A1*   4/2009  Kozisek ...................... 709/224

FOREIGN PATENT DOCUMENTS
| CN | 2453555 Y | 10/2001 |
|---|---|---|
| CN | 1606263 A | 4/2005 |
| CN | 99123302.6 | 9/2005 |
| TW | 560778 | 11/2003 |
| TW | I237973 | 8/2005 |
| TW | D114814 | 1/2007 |
| TW | I278194 | 4/2007 |

* cited by examiner

*Primary Examiner* — Edward Tso
*Assistant Examiner* — Ahmed Omar
(74) *Attorney, Agent, or Firm* — Altis Law Group, Inc.

(57) ABSTRACT

A network device includes several modules and a microcontroller for indicating working operations of the network device. The network device is configured for outputting a plurality of indicating control signals based on a detected signal power and a detected battery capacitance of the network device. The network device indicates the signal power and the battery capacitance based on the indicating control signals.

15 Claims, 3 Drawing Sheets

ABSTRACT# NETWORK DEVICE AND METHOD FOR INDICATING SIGNAL POWER TRANSMITTED AND BATTERY CAPACITANCE OF SAME

BACKGROUND

1. Field of the Invention

Embodiments of the present disclosure relates to network communications, and particularly to a network device for indicating control operations.

2. Description of Related Art

With the continued development of network communication technology, cable modems have been widely used to connect personal computers (PCs) to a central device, thereby allowing users to conveniently connect to the Internet from home.

Typically, users or operators will assess the battery capacitance or signal power of cable modems by connecting the cable modems to another PC to determine these values via a Simple Network Management Protocol (SNMP), a webpage, a console, or a Telnet interface. This method requires the cable modem to connect to an additional PC or terminal device, which is complex and time-consuming.

SUMMARY

A network device includes a power detecting module, a battery capacitance detecting module, an activating module, a microcontroller and an indicating module. The power detecting module is configured for detecting a signal power transmitted by the network device. The battery capacitance detecting module is configured for detecting a battery capacitance of the network device. The activating module is configured for receiving an external activating signal for detecting the signal power and the battery capacitance of the network device. The microcontroller is connected to the power detecting module, the battery capacitance detecting module and the activating module, for determining if an activating time of the activating signal is more than a predetermined time threshold, and for outputting a plurality of indicating control signals based on the detected signal power and the detected battery capacitance. The indicating module is connected to the microcontroller for visually indicating the signal power and the battery capacitance in turns according to the indicating control signals.

Other objectives, advantages and novel features of the present invention will become more apparent from the following detailed description of preferred embodiments when taken in conjunction with the accompanying drawings, in which:

DETAILED DESCRIPTION OF CERTAIN INVENTIVE EMBODIMENTS

Figure 1:
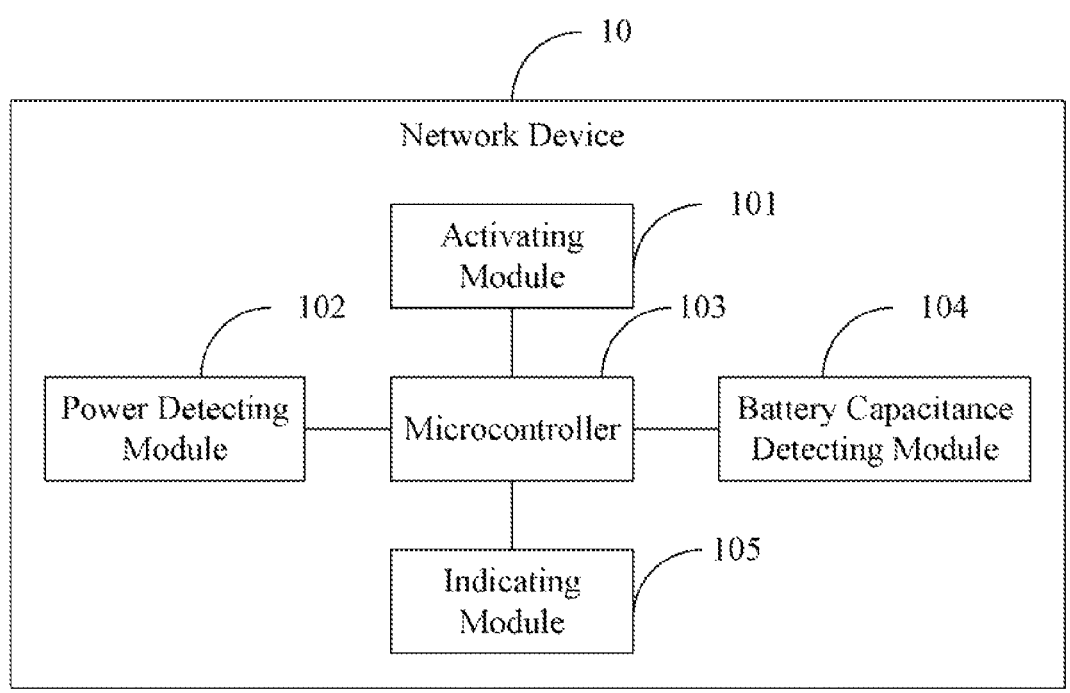
FIG. 1 is a block diagram of one embodiment of a network device of the present disclosure.

FIG. 1 is a block diagram of one embodiment of a network device 10 of the present disclosure. In one embodiment, the network device 10 may be a cable modem that can connect terminal devices, such as personal computers (PCs), to a central device, such as a cable modem termination system (CMTS). Thus, users can connect to the Internet via the network device 10, and the terminal devices can upload or download data via the network device 10. The network device 10, in one embodiment, may be used to indicate one or more signals indicative of operations of the network device 10. The one or more signals may be displayed using one or more LEDs on the network device 10.

In one embodiment, the network device 10 comprises an activating module 101, a power detecting module 102, a microcontroller 103, a battery capacitance detecting module 104, and an indicating module 105. The modules 101, 102, 104, 105 and the microcontroller 103 may be used to execute one or more operations for the network device 10 as will be explained in further detail below.

In one embodiment, the activating module 101 receives an external activating signal from a standby button of the network device 10 (not shown) pressed by a user or an operator of the network device 10. In one embodiment, the activating signal is configured for informing the microcontroller 103 to detect a signal power and/or a battery capacitance of the network device 10. The power detecting module 102 is configured for detecting the signal power transmitted and received by the network device 10, and specifically, corresponding to upstream (US) power and downstream (DS) power. The battery capacitance detecting module 104 is configured for detecting the battery capacitance of the network device 10.

The microcontroller 103 is connected to the activating module 101, the power detecting module 102, and the battery capacitance detecting module 104 for determining if an activating time of the activating signal is more than a predetermined time threshold. In one embodiment, the predetermined time threshold is 1 second, for example. If the activating time is more than the predetermined time threshold, the microcontroller 103 outputs a plurality of indicating control signals. In other words, the microcontroller 103 outputs a US power indicating control signal, a DS power indicating control signal, and a battery capacitance indicating control signal. The indicating module 105 is connected to the microcontroller 103 for indicating the signal power and the battery capacitance of the network device 10 based on the indicating control signals.

In one embodiment, the power detecting module 102 comprises a tuner configured for converting a detected radio frequency (RF) signal power to a base frequency signal identified by the microcontroller 103.

Figures 2A, 2B:
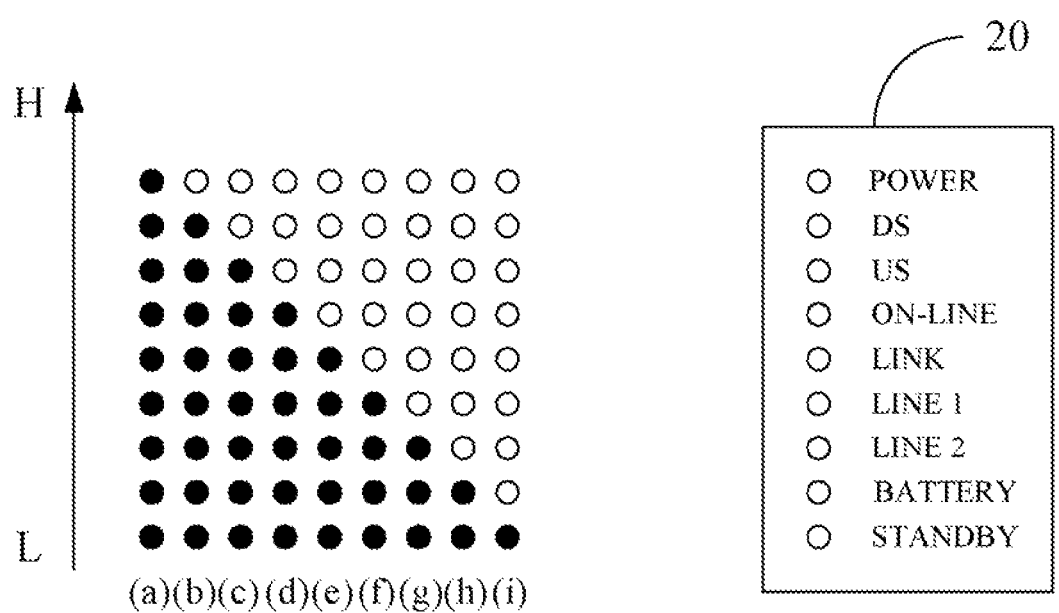
FIG. 2A is a schematic diagram of one embodiment of the signal power and the battery capacitance of the network device.
FIG. 2B illustrates one embodiment of a panel of the network device comprising nine status indicators.

Also referring to FIG. 2A and FIG. 2B, FIG. 2A is a schematic diagram of one embodiment of the signal power and the battery capacitance of the network device 10, and FIG. 2B a schematic diagram of one embodiment of a panel 20 of the network device 10. The panel 20 comprises a plurality of light emitting diodes (LEDs), which includes a power LED, a DS LED, an US LED, a on-line LED, a link LED, a line 1 LED, a line 2 LED, a battery LED, and a standby LED.

Depending on the embodiment, the network device 10 may operate in a normal working mode or in a backup working mode. The normal working mode defines a mode when the network device 10 is connected to the central device and users can connect to the Internet using the network device 10. The backup working mode defines a mode when the network device 10 is disconnected from the central device and users cannot connect to the Internet despite maintaining connections between the terminal devices and the network device 10.

Further description of the normal working mode and the backup working mode will be further described below.

The normal working mode, in one embodiment, defines a mode where the LEDs of the network device 10 may display one or more lights indicative of one or more respective operations of the network device 10. Because the normal working mode of a network device 10 is known by one of ordinary skill in the art, details of the normal working mode are omitted from the present disclosure.

The network device 10 may indicate the signal power and the battery capacitance of the network device 10 using one or more LEDs of the network device 10. For example, when a user want to check the signal power and the battery capacitance, a standby button of the network device 10 (not shown) may be pressed. The microcontroller 103 receives the standby activating signal and determines if an activating time of the standby activating signal is more than a predetermined time threshold. If the activating time is less than or equal to the predetermined time threshold, the network device 10 enters into the backup working mode. If the activating time is more than the predetermined time threshold, the network device 10 indicates the signal power and the battery capacitance of the network device 10 using one or more LEDs of the network device 10.

Specifically, the network device 10 initially activates just the DS LED to indicate a DS power of the network device 10. Afterwards, one or more other or same LEDs of the network device 10 may be lit to indicate a DS power level of the network device. In one embodiment, more LEDs may be lit to indicate a higher DS power level of the network device 10. Accordingly, less LEDS may be lit to indicate a lower DS power level of the network device 10. The LEDs corresponding to the DS power level of the network device 10 may stay lit for a predetermined amount of time.

After indicating the DS power of the network device 10, the network device 10 is activated to light the US LED to indicate US power of the network device 10. The US power of the network device 10 may be displayed using one or more LEDs in substantially the same manner as the DS power.

After indicating the US power, the network device 10 is activated to light the battery LED to indicate the battery capacitance of the network device 10. The battery capacitance of the network device 10 may be displayed using one or more LEDs in substantially the same manner as the DS power. In one embodiment, the notification sequence of the DS power, the US power, and the battery capacitance can be configured to be substantially real-time.

FIG. 2B illustrates one embodiment of a panel of the network device comprising nine status indicators. These status indicators may indicate one or more working operations of the network device 10 and are indicated below as status (a)-status (i). In status (a), all nine LEDs may be lit to indicate that the network device 10 has a very strong DS power, US power, or battery capacitance. In status (b), eight LEDs of the network device 10, such as the DS LED, the US LED, the on-line LED, the link LED, the line 1 LED, the line 2 LED, the battery LED and the standby LED, are lit to indicate that the DS power, the US power or the battery capacitance is weaker than that of status (a). In one embodiment, status (c) is weaker than status (b), and status (d) is weaker than status (c), maintaining the same pattern through status (i). In status (h), two LEDs, such as battery LED and standby LED, are lit. In status (i), only one LED, such as standby LED, is lit. When the DS power, the US power or the battery capacitance is indicated by status (h) or (i), which corresponds to the DS power, the US power or the battery capacitance is low. Accordingly, when the DS power, the US power, or the battery capacitance is low, the DS LED, the US LED, or the battery corresponding LEDs of the network device 10 may flicker as a notification to the user. At the same time, the network device 10 compares the detected signal power or the battery capacitance to a respective predetermined power value or battery capacitance value. If the detected signal power or battery capacitance is lower than the predetermined value, LEDs corresponding to the signal power or the battery capacitance may be flicker to notify the user. In one embodiment, the predetermined power value or battery capacitance value can be set as needed.

Figure 3:
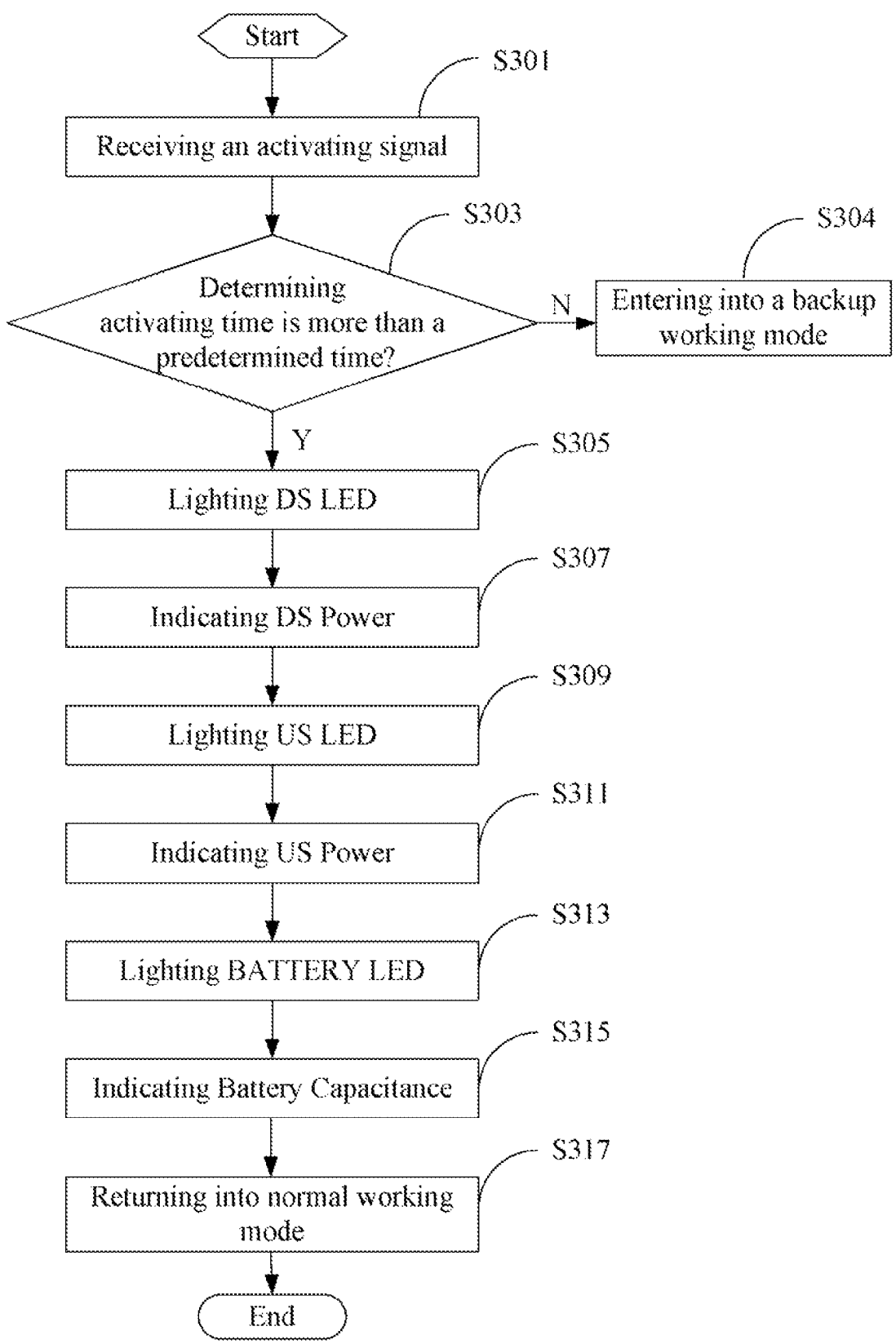
FIG. 3 is a flowchart of one embodiment of a method for indicating the signal power and the battery capacitance of the network device.

FIG. 3 is a flowchart of one embodiment of a method for indicating the signal power and the battery capacitance of the network device 10. In a block S301, the activating module 101 receives an external activating signal from a standby button of the network device 10 (not shown) pressed by the users or operators. In a block S303, the microcontroller 103 determines if the activating time of the activating signal exceeds the predetermined time threshold, such as 1 second. In a block S304, the network device 10 enters the backup working mode if the activating time is less than the predetermined time threshold. In a block S305, the DS LED is lit to inform the users or operators of DS power if the activating time exceeds the predetermined time threshold. In a block S307, the network device 10 is activated to light one or more LEDs to indicate the DS power of the network device 10. In a block S309, the US LED is lit to inform the users or operators to indicate the US power of the network device 10. In a block S311, the network device 10 is activated to light one or more LEDs to indicate the US power of the network device 10. In a block S313, the battery capacitance LED is lit to inform the users or operators to indicate the battery capacitance of the network device 10. In a block S315, the network device 10 is activated to light one or more LEDs to indicate the battery capacitance of the network device 10. Finally, in a block S317, the network device 10 returns into the normal working mode.

In the present disclosure, the network device 10 utilizes current LEDs and hardware, and cooperates with relative software to indicate power signal transmitted and battery capacitance of the network device 10. When the signal power and the battery capacitance are low, corresponding LEDs may flicker so as to notify a users or an operator of the network device 10.

The description of the present disclosure has been presented for purposes of illustration and description, and is not intended to be exhaustive or limited to the disclosure in the form disclosed. Many modifications and variations will be apparent to those of ordinary skill in the art. Various embodiments were chosen and described in order to best explain the principles of the disclosure, the practical application, and to enable others of ordinary skill in the art to understand the disclosure for various embodiments with various modifications as are suited to the particular use contemplated.

What is claimed is:

1. A network device, comprising:
   a power detecting module configured for detecting a signal power transmitted by the network device;
   a battery capacitance detecting module configured for detecting a battery capacitance of the network device;
   an activating module configured for receiving an external activating signal for detecting the signal power and the battery capacitance of the network device;
   a microcontroller connected to the power detecting module, the battery capacitance detecting module and the activating module, for determining if an activating time of the activating signal is more than a predetermined time threshold, and for outputting a plurality of indicating control signals based on the detected signal power and the detected battery capacitance; and an indicating module, connected to the microcontroller, configured for visually indicating the signal power and the battery capacitance according to the indicating control signals.

2. The network device as claimed in claim 1, wherein the power detecting module comprises a tuner.

3. The network device as claimed in claim 1, wherein the microcontroller outputs the plurality of indicating control signals upon the condition that the activating time of the activating signal exceeds the predetermined time threshold.

4. The network device as claimed in claim 1, wherein the plurality indicating control signals comprises an upstream (US) power indicating control signal, a downstream (DS) power indicating control signal, and a battery capacitance indicating control signal.

5. The network device as claimed in claim 1, further comprising a panel comprising a plurality of light emitting diodes (LEDs).

6. The network device as claimed in claim 5, wherein the plurality of indicating control signals are configured for controlling lighting one or more of the LEDs.

7. The network device as claimed in claim 5, wherein the plurality of LEDs comprises a DS LED, an US LED, and a battery capacitance LED.

8. The network device as claimed in claim 7, wherein the DS LED is configured for flickering upon the condition that the DS signal power is lower than a DS predetermined power value.

9. The network device as claimed in claim 7, wherein the US LED is configured for flickering upon the condition that the US signal power is lower than a US predetermined power value.

10. The network device as claimed in claim 5, wherein the battery LED is configured for flickering upon the condition that the battery capacitance is lower than a predetermined battery capacitance value.

11. A method for indicating a signal power and a battery capacitance of a network device comprising a plurality lighting emitting diodes (LEDs), the method comprising:
receiving an activating signal from a standby button of the network device;
determining if an activating time of the activating signal exceeds a predetermined time threshold;
lighting one or more of the plurality of LEDs for indicating a downstream (DS) power of the network device upon the condition that the activating time exceeds the predetermined time threshold;
lighting one or more of the plurality of LEDs for indicating an upstream (US) power of the network device; and
lighting one or more of the plurality of LEDs for indicating a battery capacitance of the network device.

12. The method as claimed in claim 11, further comprising lighting a DS LED.

13. The method as claimed in claim 11, further comprising lighting a US LED.

14. The method as claimed in claim 11, further comprising lighting a battery LED.

15. The method as claimed in claim 11, further comprising entering a backup working mode, if the activating time is not more than the predetermined time threshold.

* * * * *